(12) United States Patent
Chen et al.

(10) Patent No.: US 9,793,231 B2
(45) Date of Patent: Oct. 17, 2017

(54) UNDER BUMP METALLURGY (UBM) AND METHODS OF FORMING SAME

(71) Applicant: Taiwan Semiconductor Manufacturing Company, Ltd., Hsin-Chu (TW)

(72) Inventors: Wei-Yu Chen, Taipei (TW); Hsien-Wei Chen, Hsin-Chu (TW); An-Jhih Su, Bade (TW); Cheng-Hsien Hsieh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/788,182

(22) Filed: Jun. 30, 2015

(65) Prior Publication Data
US 2017/0005052 A1 Jan. 5, 2017

(51) Int. Cl.
H01L 23/00 (2006.01)
H01L 23/488 (2006.01)
H01L 23/522 (2006.01)
H01L 23/498 (2006.01)
H01L 21/768 (2006.01)

(52) U.S. Cl.
CPC ........ *H01L 24/13* (2013.01); *H01L 21/76885* (2013.01); *H01L 23/49816* (2013.01); *H01L 24/03* (2013.01); *H01L 24/05* (2013.01); *H01L 24/11* (2013.01); *H01L 2224/024* (2013.01); *H01L 2224/0231* (2013.01); *H01L 2224/02166* (2013.01); *H01L 2224/02379* (2013.01); *H01L 2224/03622* (2013.01); *H01L 2224/0401* (2013.01); *H01L 2224/05024* (2013.01); *H01L 2224/11334* (2013.01); *H01L 2224/13014* (2013.01); *H01L 2224/13016* (2013.01); *H01L 2924/2064* (2013.01)

(58) Field of Classification Search
CPC ........ H01L 24/13; H01L 24/11; H01L 24/05; H01L 24/03; H01L 23/49816; H01L 21/76885
USPC ........ 257/737, 738, 751, E23.021, E23.023, 257/E21.476, E21.508; 438/615, 614, 438/613
See application file for complete search history.

(56) References Cited

U.S. PATENT DOCUMENTS 6,150,725 A * 11/2000 Misawa .............. H01L 23/3171
257/725
7,816,252 B2 * 10/2010 Yu .......................... H01L 24/11
257/738
8,361,842 B2 1/2013 Yu et al.
(Continued)

FOREIGN PATENT DOCUMENTS

KR 20150030134 A 3/2015
TW 201041058 A 11/2010
(Continued)

*Primary Examiner* — Dao H Nguyen
(74) *Attorney, Agent, or Firm* — Slater Matsil, LLP (57) ABSTRACT

A device package includes a die, fan-out redistribution layers (RDLs) over the die, and an under bump metallurgy (UBM) over the fan-out RDLs. The UBM comprises a conductive pad portion and a trench encircling the conductive pad portion. The device package further includes a connector disposed on the conductive pad portion of the UBM. The fan-out RDLs electrically connect the connector and the UBM to the die.

19 Claims, 9 Drawing Sheets

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,425,121 B2 | 8/2016 | Tsai et al. | |
| 2002/0173134 A1* | 11/2002 | Viswanadam | H01L 24/11 438/613 |
| 2010/0237495 A1 | 9/2010 | Pagaila et al. | |
| 2011/0193224 A1* | 8/2011 | Ito | H01L 23/3157 257/737 |
| 2011/0291288 A1 | 12/2011 | Wu et al. | |
| 2012/0241985 A1* | 9/2012 | Topacio | H01L 24/03 257/782 |
| 2012/0295402 A1 | 11/2012 | Lee et al. | |
| 2012/0326299 A1* | 12/2012 | Topacio | H01L 23/3171 257/737 |
| 2013/0026468 A1 | 1/2013 | Yoshimuta et al. | |
| 2013/0048358 A1* | 2/2013 | Kanki | H01L 23/49816 174/258 |
| 2013/0062760 A1 | 3/2013 | Hung et al. | |
| 2013/0062761 A1 | 3/2013 | Lin et al. | |
| 2013/0168805 A1* | 7/2013 | Yu | H01L 23/3192 257/528 |
| 2013/0168848 A1 | 7/2013 | Lin et al. | |
| 2013/0307140 A1 | 11/2013 | Huang et al. | |
| 2014/0061923 A1 | 3/2014 | Chen et al. | |
| 2014/0159233 A1 | 6/2014 | Lin et al. | |
| 2014/0203429 A1 | 7/2014 | Yu et al. | |
| 2014/0203438 A1 | 7/2014 | Chen et al. | |
| 2014/0225222 A1 | 8/2014 | Yu et al. | |
| 2014/0252593 A1 | 9/2014 | Chen | |
| 2014/0252611 A1* | 9/2014 | Chen | H01L 23/49816 257/738 |
| 2014/0252646 A1 | 9/2014 | Hung et al. | |
| 2014/0264930 A1 | 9/2014 | Yu et al. | |
| 2015/0123269 A1* | 5/2015 | Chen | H01L 23/562 257/737 |
| 2015/0162289 A1 | 6/2015 | Chang et al. | |
| 2016/0064346 A1* | 3/2016 | Ootsuki | H01L 24/05 257/774 |

FOREIGN PATENT DOCUMENTS

| | | |
|---|---|---|
| TW | 201409647 A | 3/2014 |
| TW | 201423918 A | 6/2014 |

* cited by examiner

UNDER BUMP METALLURGY (UBM) AND METHODS OF FORMING SAME

BACKGROUND

In an aspect of conventional packaging technologies, such as wafer level packaging (WLP), redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, a molding compound may be formed around the die to provide surface area to support the fan-out interconnect structures. For example, RDLs typically include one or more polymer layers formed over the die and molding compound. Conductive features (e.g., conductive lines and/or vias) are formed in the polymer layers and electrically connect I/O pads on the die to the external I/O pads over the RDLs. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a package having fan-out redistribution layers (RDLs) formed over a semiconductor device die. An under bump metallurgy (UBM) is formed over a top-most conductive line of the RDLs, and a trench is patterned in the UBM. For example, the UBM may include a conductive pad portion and a retaining wall portion encircling the conductive pad portion, where the trench physically separates the conductive pad portion and the retaining wall portion. An external connector (e.g., a solder ball) is mounted on the conductive pad portion of the UBM, and a reflow process may be applied to adhere the connector to the UBM. During reflow, conductive material (e.g., solder flux) may flow out from under the connector. By including a trench and a retaining wall around the conductive pad, the flux may be contained within the UBM, and the flux may not flow outwards to damage other features of the device package. For example, the flux may be prevented from attacking an interface between conductive features and polymer layers of the RDLs. Thus, delamination issues from reflow may be reduced, improving manufacturing yield. Furthermore, the UBM and the conductive line may be formed using a single seed layer, which advantageously reduces manufacturing costs.

Figure 1A:
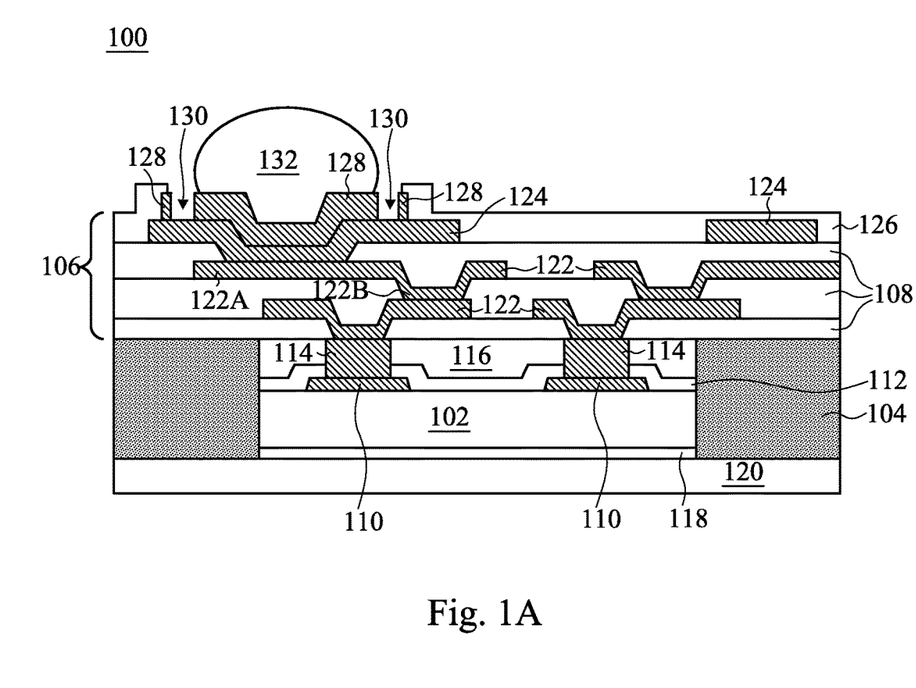
FIGS. 1A through 1C illustrate cross-sectional views of device packages in accordance with some embodiments.

FIG. 1A illustrates a cross-sectional view of a fan-out device package 100 in accordance with various embodiments. Package 100 includes a die 102, a molding compound 104 disposed around the die, and RDLs 106 (e.g., having conductive features 122) formed over die 102 and molding compound 104. Die 102 may be a semiconductor die and could be any type of integrated circuit, such as a processor, logic circuitry, memory, analog circuit, digital circuit, mixed signal, and the like.

Die 102 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Input/output (I/O) and passivation features may be formed over the interconnect structure. For example, contact pads 110 may be formed over the interconnect structure and may be electrically connected to the active devices through the various conductive features in the interconnect structure. Contact pads 110 may comprise a conductive material such as aluminum, copper, and the like. Furthermore, a passivation layer 112 may be formed over the interconnect structure and the contact pads. In some embodiments, passivation layer 112 may be formed of non-organic materials such as silicon oxide, un-doped silicate glass, silicon oxynitride, and the like. Other suitable passivation materials may also be used. Portions of passivation layer 112 may cover edge portions of the contact pads 110.

Additional interconnect features, such as additional passivation layers, conductive pillars, and/or under bump metallurgy (UBM) layers, may also be optionally formed over contact pad 110. For example, as illustrated by FIG. 1A, conductive pillars 114 may be formed on and electrically connect to contact pads 110, and a dielectric layer 116 may be formed around such conductive pillars 114. The various features of dies 102 may be formed by any suitable method and are not described in further detail herein. Furthermore, the general features and configuration of dies 102 described above are but one example embodiment, and dies 102 may include any combination of any number of the above features as well as other features.

Although described as a die 102 throughout, one of ordinary skill will readily understand that some processing on die 102 may occur while die 102 is part of a larger substrate, for example, a wafer. After formation, die 102 may be singulated from other structures (e.g., other dies) in the wafer and attached to a carrier 120 (e.g., using a die attach film (DAF) 118) for further processing. Carrier 120 may be a glass or ceramic carrier and may provide temporary structural support during the formation of various features of package 100.

Molding compound 104 is disposed around die 102. For example, in a top down view of molding compound 104/die 102 (not illustrated), molding compound 104 may encircle die 102. Molding compound 104 may provide suitable surfaces for forming fan-out RDLs, such as RDLs 106. Molding compound 104 may include any suitable material such as an epoxy resin, a molding underfill, and the like. Suitable methods for forming molding compound 104 may include compressive molding, transfer molding, liquid encapsulent molding, and the like. For example, molding compound 104 may be around die 102 in liquid form. Subsequently, a curing process is performed to solidify molding compound 104. The filling of molding compound 104 may overflow die 102 so that molding compound 104 covers top surfaces of die 102. A mechanical grinding, chemical mechanical polish (CMP), or other etch back technique may be employed to remove excess portions of molding compound 104 and expose connectors (e.g., conductive pillars 114) of die 102. After planarization, top surfaces of molding compound 104 and die 102 may be substantially level.

One or more RDLs 106 may be formed over die 102 and molding compound 104. RDLs 106 may extend laterally past edges of die 102 to provide fan-out interconnect structures. RDLs 106 may include one or more polymer layers 108 formed over top surfaces of die 102 and molding compound 104. In some embodiments, polymer layers 108 may comprise polyimide (PI), PBO, benzocyclobuten (BCB), epoxy, silicone, acrylates, nano-filled pheno resin, siloxane, a fluorinated polymer, polynorbornene, and the like formed using any suitable means such as spin-on techniques, and the like.

Conductive features 122 (e.g., conductive lines 122A and conductive vias 122B) are formed within polymer layers 108. Conductive lines 120A may be formed over polymer layer 108, and conductive vias 120B may extend through polymer layer 108 and electrically connect to contact pads 110 of die 102. Although three polymer layers 108 are explicitly illustrated, RDLs 106 may further include any number of polymer layers having conductive features disposed therein depending on package design.

RDLs 106 may further include a top-most polymer layer 126, which may be disposed at an external surface of package 100. Polymer layer 126 may include top-most conductive lines 124, which are electrically connected to underlying die 102 by conductive features 122. Conductive lines 124 may be redistribution lines for electrical routing as well as a platform for forming input/output features. In some embodiments, conductive lines 124 may also be referred to as under bump metallurgy-less (UBML) pads 124.

Figure 1B:
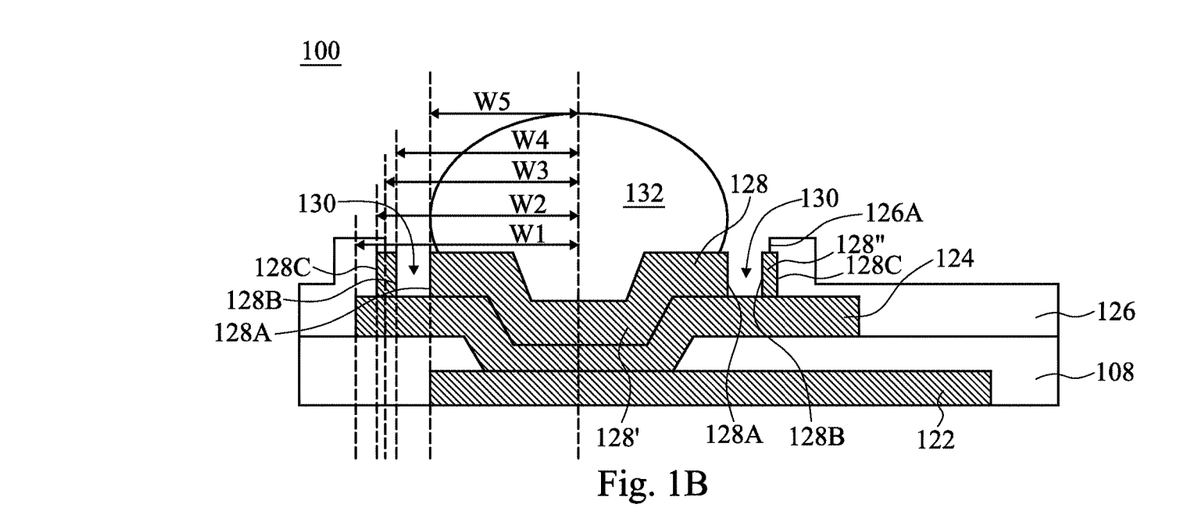
Figure 1C:
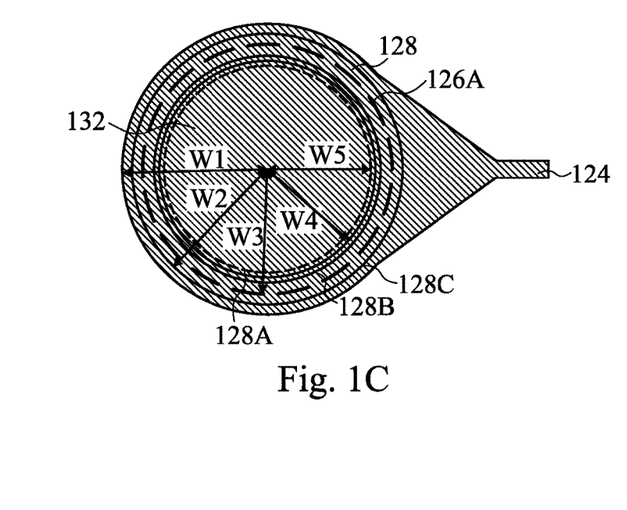

Additional package features, such as UBMs 128 and external connectors 132 are formed over conductive lines 124 of RDLs 106. FIG. 1B illustrates a detailed cross-sectional view of such features in package 100. FIG. 1C illustrates a corresponding top down view of UBMs 128, external connectors 132, and conductive line 124. Connectors 132 may be solder balls, such as, ball grid array (BGA) balls, controlled collapse chip connector (C4) bumps, microbumps, and the like. Connectors 132 may be electrically connected to die 102 by way of conductive features 122 in RDLs 106. Connectors 132 may be used to electrically connect package 100 to other package components such as another device die, interposers, package substrates, printed circuit boards, a mother board, and the like.

In various embodiments, connectors 132 are disposed on UBMs 128, which may be formed over conductive lines 124. Although only a single connector 132 and a single UBM 128 are illustrated for simplicity, package 100 may include any number of UBMs 128/connectors 132. An opening may be patterned in polymer layer 126 to expose UBM 128, and polymer layer 126 may cover edge portions of UBMs 128.

In some embodiments, UBMs 128 are formed directly on conductive lines 124. As will be explained in greater detail in subsequent paragraphs, UBMs 128 and conductive lines 124 may be formed using a single seed layer, advantageously reducing manufacturing costs. Trenches 130 are patterned in UBMs 128. For example, trenches 130 physically separate a retaining wall portion 128" and a conductive pad portion 128' of a UBM 128. Trenches 130 may encircle connectors 132 (see e.g., FIG. 1C) to contain flux that may flow out from connectors 132 during reflow. For example, when connectors 132 are mounted onto UBMs 128, a reflow process may be used to bond connectors 132 with UBMs 128. During reflow, flux may flow out from connectors 132 and may attack interfaces between different package materials (e.g., an interface between polymer layer 126 and conductive line 124), which may result in delamination and/or other defects. These defects may further be exacerbated in testing processes, such as thermal cycle tests, which may be applied to package 100. By forming trenches 130 around connectors 132, flux may be contained in trenches 130 without flowing into other areas of package 100, reducing package defects (e.g., delamination between polymer layers and conductive features).

In FIGS. 1B and 1C, lateral dimension W1 corresponds to a distance between a center of connector 132 and a closest edge of conductive line 124 to the center of connector 132. Lateral dimension W2 corresponds to a distance between a center of connector 132 and a farthest edge 128A of UBM 128 to the center of connector 132. Lateral dimension W3 corresponds to a distance between a center of connector 132 and a closest sidewall 126A of polymer layer 126 to the center of connector 132. Lateral dimension W4 corresponds to a distance between a center of connector 132 and a farthest sidewall 128C of trench 130 to the center of connector 132. Lateral dimension W5 corresponds to a distance between a center of connector 132 and a closest sidewall 128B of trench 130 to the center of connector 132. In package 100, lateral dimension W1 is greater than lateral dimension W2 is greater than lateral dimension W3 is greater than lateral dimension W4 is greater than lateral dimension W5. Furthermore, a lateral dimension of trench 130 (e.g., W4 minus W5) may be about 10 µm to about 20 µm. Furthermore, a lateral dimension of retaining wall portion 128" (e.g., W3 minus W4) may also be about 10 µm to about 20 µm.

Figure 2:
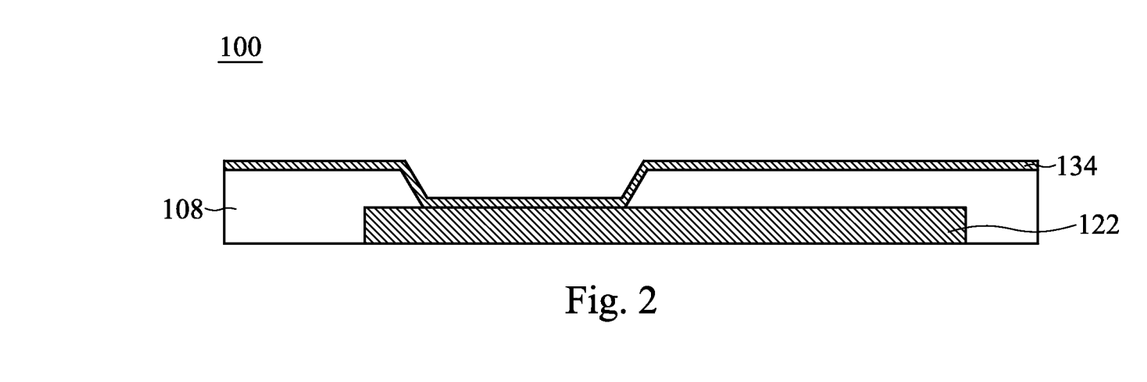
FIGS. 2 through 9 illustrate cross-sectional views of intermediary steps of manufacturing a device package in accordance with some embodiments.

FIGS. 2 through 9 illustrate cross-sectional views of various intermediary stages of forming top-most conductive line 124, UBM 128, and connector 132 in accordance with some embodiments. In FIG. 2, a cross-sectional view of a portion of package 100 (polymer layer 108 having a conductive features 122) is provided. Polymer layer 108 may be part of RDLs 106, which is formed over a device die 102 and molding compound 104 as described above (see FIG. 1A). Also shown FIG. 2 is a conductive seed layer 134 comprising copper, for example. Seed layer 134 is electrically connected to underlying conductive feature 122. In an embodiment, forming seed layer 134 includes an opening in polymer layer 108 to expose conductive feature 122 using photolithography and/or etching, for example. Subsequently, seed layer 134 may be deposited over polymer layer 108 and in the opening using atomic layer deposition, CVD, or other conformal process.

Figure 3:
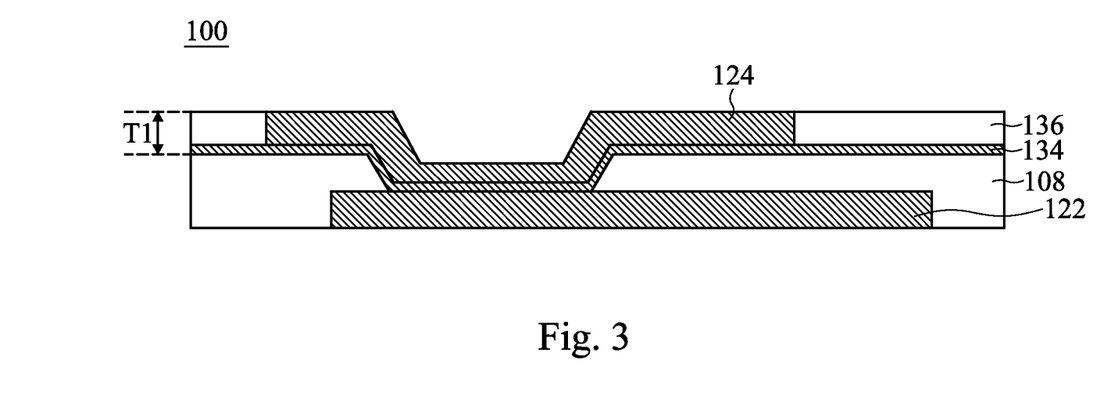

Referring next to FIG. 3, conductive line 124 is formed on seed layer 134. A patterned mask layer 136 may be used to define a shape of conductive line 124. In an embodiment, mask layer 136 is a photoresist blanket deposited over seed layer 134 and subsequently patterned using photolithography, for example. The photolithography process may include, for example, exposing portions of mask layer 136 through a lithography mask using ultraviolet light, for example. Subsequently, exposed or unexposed portions of mask layer 136 are developed and removed depending on whether a positive or negative resist is used. Thus, an opening exposing seed layer 134 may be formed in mask layer 136. In another embodiment, mask layer 136 may be a hard mask (e.g., comprising silicon nitride, and the like). In such embodiments a photoresist (not shown) may be formed and patterned over mask layer 136, and the pattern of the photoresist is then transferred to mask layer 136 using a suitable etching process, for example.

After mask layer 136 is patterned, conductive line 124 is formed in the opening using a suitable process, such as, electroless plating, electro-chemical plating, and the like. Seed layer 134 provides nucleation sites during the plating process to allow for bottom up growth of conductive line 124 having good uniformity. As a result of the plating process, conductive line 124 may merge with underlying seed layer 134, and a total thickness T1 of conductive line 124 (including seed layer 134) may be about 5 µm to about 8 µm in an example embodiment. Other dimensions for conductive line 124 may be used in other embodiments. After conductive line 124 is formed, mask layer 136 may be removed using any suitable process. For example, when mask layer 136 is a photoresist, a plasma ashing or wet strip process may be used to remove mask layer 136. Optionally, the plasma ashing process may be followed by a wet dip in a sulfuric acid ($H_2SO_4$) solution to package 100 and remove remaining photoresist material. In another example, when mask layer 136 is a hard mask, a selective etching process may be used to remove mask layer 136.

Figure 4:
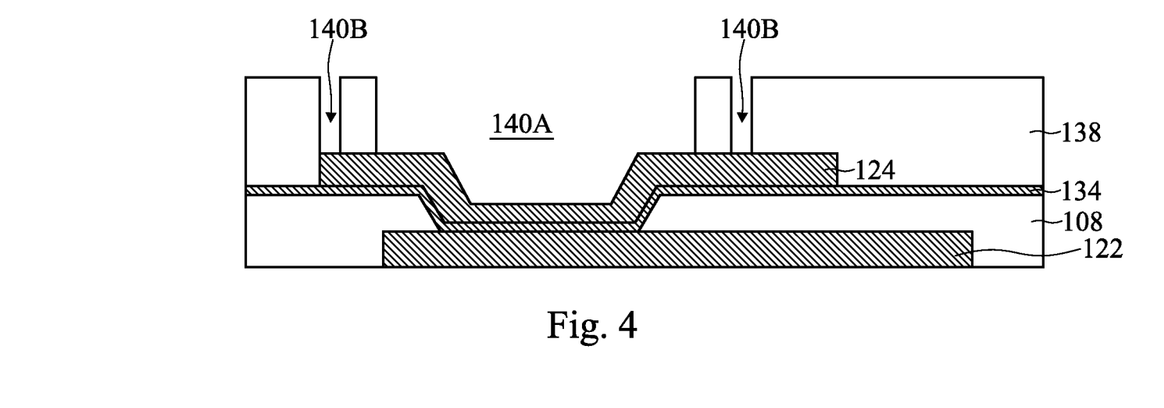
Figure 5:
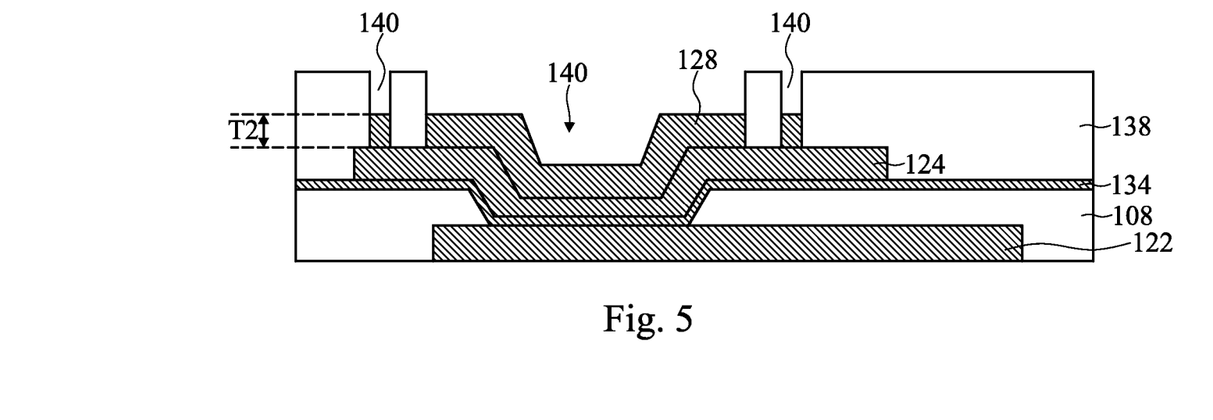

Next, in FIGS. 4 and 5, UBMs 128 are formed over seed layer 134 and conductive line 124. In FIG. 4, a second mask layer 138 is deposited over seed layer 134 and conductive line 124. Mask layer 138 may be similar to mask layer 136, and mask layer 138 may be patterned to include openings 140 (labeled 140A and 140B) using a similar process as described above. Openings 140 expose underlying conductive line 124, and mask layer may be used to define a shape of each UBM 128. For example, openings 140 may include a first opening 140A for defining a conductive pad portion of an UBM 128 and a second opening 140B for defining a retaining wall portion of UBM 128. In a top-down view (not shown), opening 140B may encircle opening 140A. A portion of mask layer 138 may remain disposed between the openings 140A and 140B.

Next, in FIG. 5, UBMs 128 are formed in openings 140 using a suitable process, such as, electroless plating, electrochemical plating, and the like. UBMs 128 have a thickness T2 of about 1.5 µm to about 5 µm, for example. Other dimensions for UBMs 128 may be used in other embodiments. UBMs 128 may be formed directly on an exposed surface of conductive line 124, and the conductive material of conductive line 124 provides nucleation sites during the formation of UBMs 128. As discussed above, conductive lines 124 is patterned to provide electrical routing for circuitry in package 100. Thus, in some areas of package 100 (e.g., in areas where conductive lines 124 are not available), UBMs 128 may be formed directly on seed layer 134 (not explicitly illustrated). In such areas, seed layer 134 provides nucleation sites for the formation of UBMs 128. Thus, in example embodiments, a single seed layer 134 is used to form both conductive lines 124 and UBMs 128, saving manufacturing costs. For example, seed layer 134 is not etched before UBMs 128 are formed.

Figure 6A:
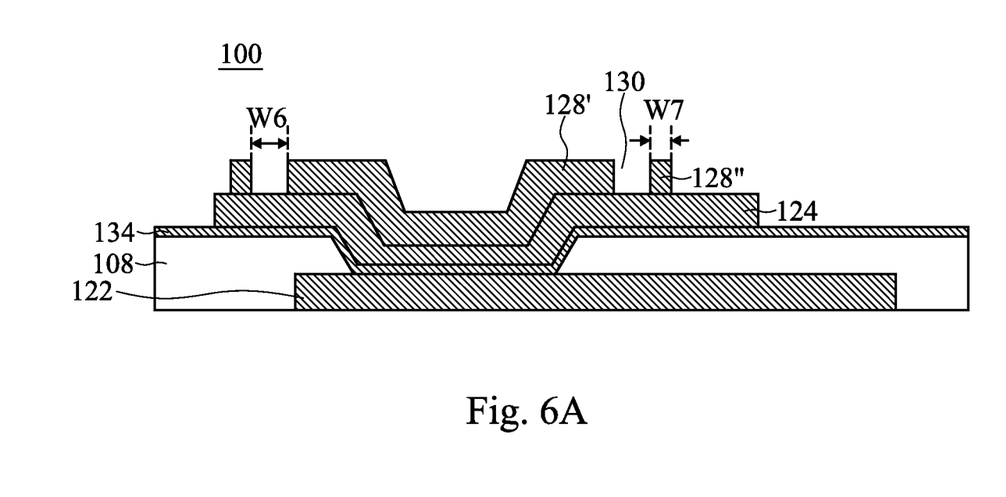
Figure 6B:
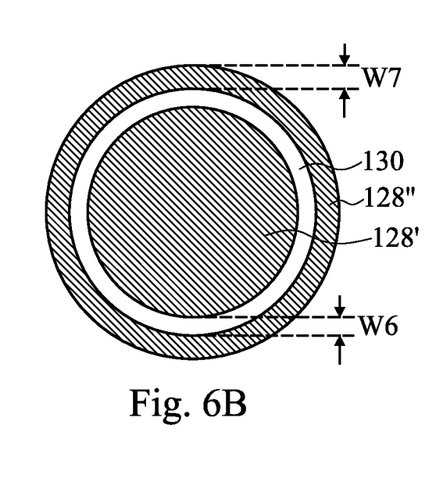

Subsequently, mask layer 138 is removed as described above. The resulting structure is illustrated in FIGS. 6A and 6B. FIG. 6A illustrates a cross-sectional view, and FIG. 6B illustrates a corresponding top-down view of UBM 128. UBM 128 includes a trench 130 encircling a conductive pad portion 128' of UBM 128 (see FIG. 6B). In subsequent process steps, an external connector (e.g., a solder ball) is disposed on conductive pad portion 128' of UBM 128. A retaining wall portion 128" forms a ring around trench 130 and conductive pad portion 128'. As illustrated in FIG. 6B, retaining wall portion 128" encircles trench 130 and conductive pad portion 128'. For example, retaining wall portion 128" is physically separated from conductive pad by a spacing (trench 130). Trench 130 has a width W6 of about 10 µm to about 20 µm, for example. Width W6 also corresponds a spacing between retaining wall portion 128" and conductive pad portion 128' of UBM 128. Retaining wall portion 128" has a width W7 of about 10 µm to about 20 µm, for example. Thus, UBM 128 have a trench 130 patterned therein may be formed over conductive line 124 and seed layer 134.

Figure 7:
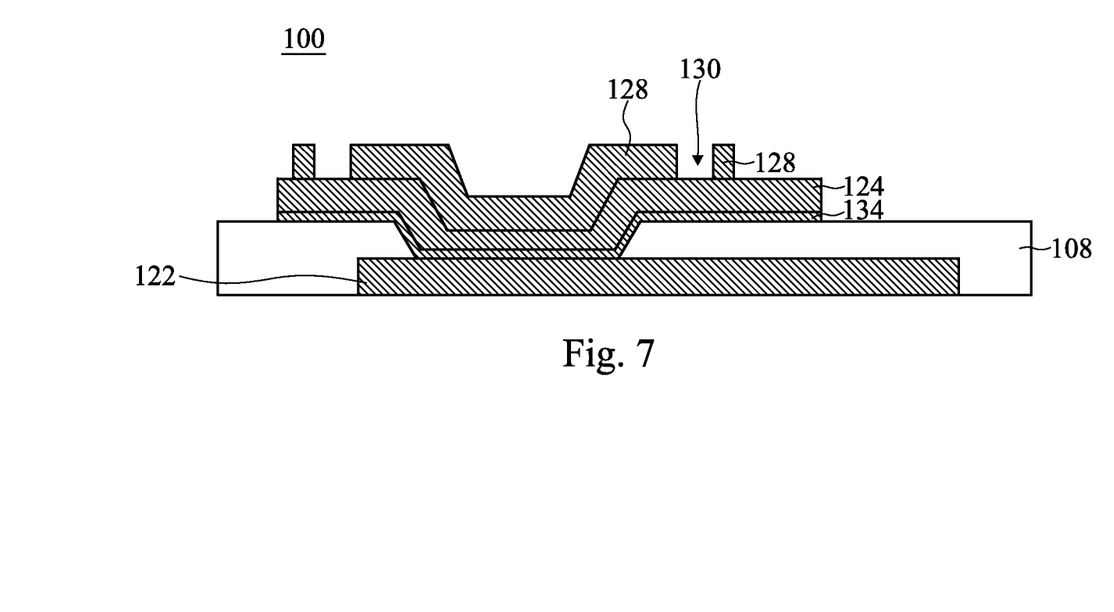
Figure 8:
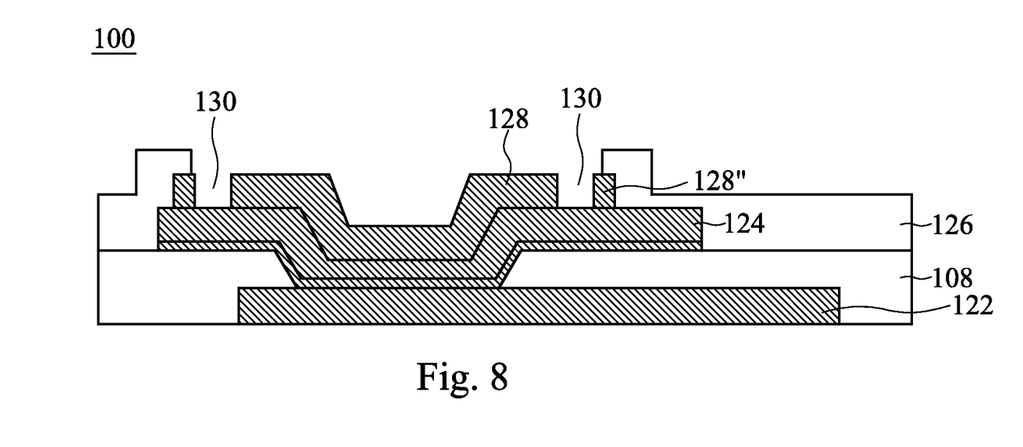

After UBM 128 is formed, seed layer 138 is patterned using a combination of photolithography and etching, for example. For example, portions of seed layer 138 not covered by conductive line 124 or UBM 128 is removed. The resulting structure is illustrated in FIG. 7. Next, in FIG. 8, a polymer layer 126 is formed over polymer layer 108, conductive line 124, and UBM 128. Polymer layer 126 may cover edge portions of UBM 128. In some embodiments, polymer layer 126 is first deposited as a conformal layer using a suitable process, such as CVD, and the like. Polymer layer 126 is then patterned to at least partially expose UBM 128 using photolithography and/or etching processes, for example. In package 100, sidewalls of polymer layer 126 may be disposed on a top surface of a retaining wall portion of UBM 128.

Figure 9:
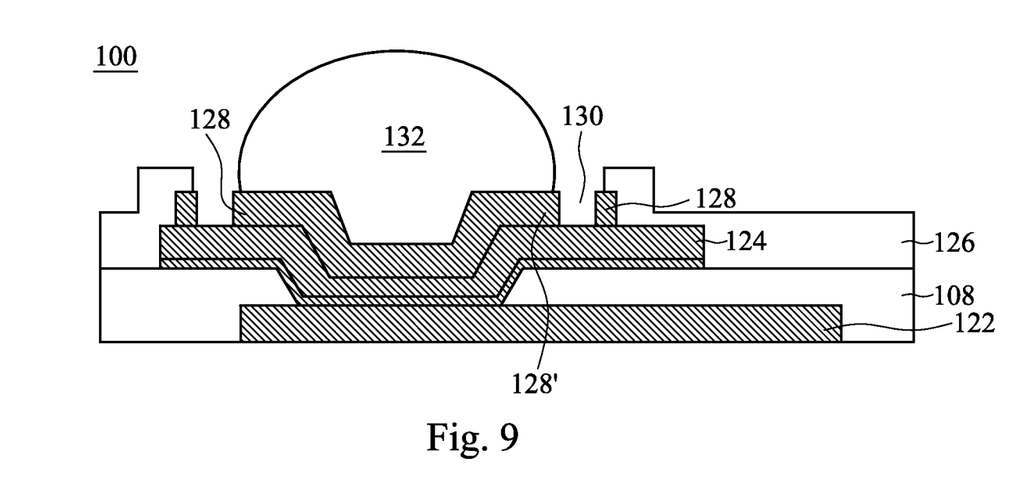

Subsequently, in FIG. 9, a connector 132 is mounted onto UBM 128. Connector 132 is disposed on a conductive pad portion 128' of UBM 128. In an embodiment, connectors 132 are mounted by initially placing a solder flux (not shown) onto the conductive pad portion 128' of UBM 128. The solder flux may be applied by brushing, spraying, a stencil, or other methods, as examples. The solder flux generally has an acidic component that removes oxide barriers, and an adhesive quality that helps to prevent movement during the process. The solder flux may be simultaneously placed on all UBMs 128 in package 100. Other types of materials may also be utilized to aid the connection between connector 132 and UBMs 128, such as a solder paste, an adhesive, or the like.

Once the solder flux is in place, connector 132 may be physically placed in contact with the solder flux using, e.g., a pick and place operation, although any suitable placement methodology may alternatively be utilized. Once in contact, a reflow may be performed to reflow the material of connector 132 and the solder flux to physically bond the connector 132 to underlying UBM 128. The reflow process may cause a chemical reaction that consumes a portion of UBM 128 and/or underlying conductive line 124. Thus, UBM 128 and conductive line 124 are formed at a sufficient thickness (e.g., in the example thickness ranges given above) to accommodate such reactions caused by reflow without damaging underlying package features. Furthermore, during reflow, the solder flux or the material of connector 132 may spread laterally out from under connector 132. Trenches 130 and retaining wall portion 128" are used to contain the flow of such materials. Thus, the conductive material may be contained away from attacking other device features, which reduces the risk of manufacturing defects (e.g., delamination).

Figure 10A:
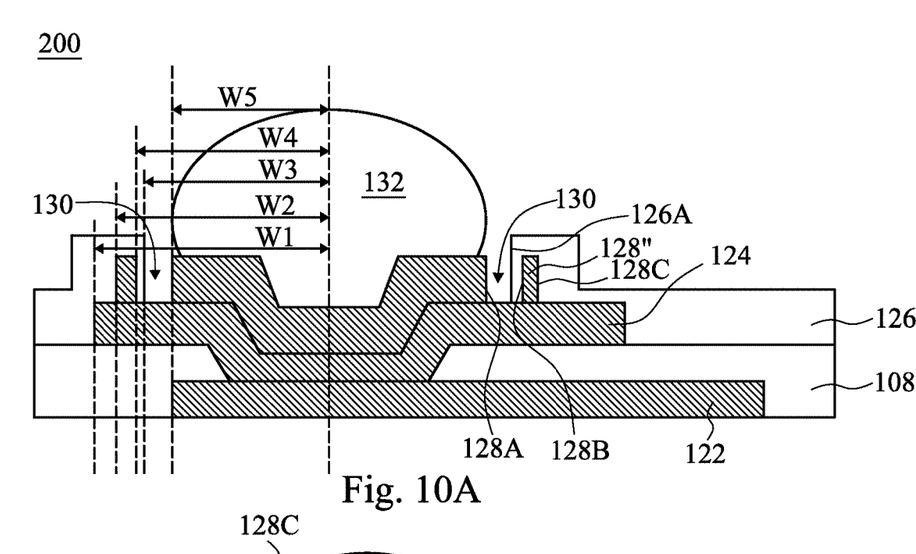
FIGS. 10A and 10B illustrate cross-sectional views of a device package in accordance with some alternative embodiments.
Figure 10B:
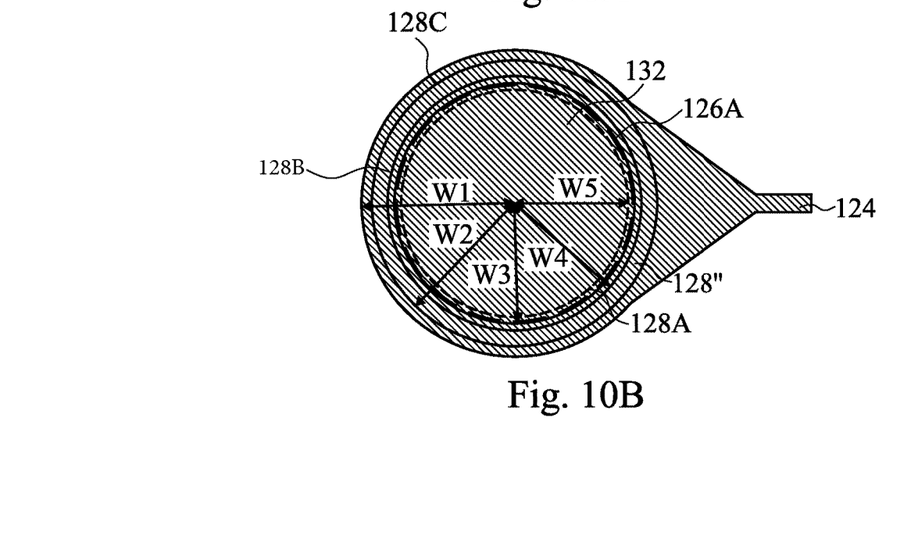

FIG. 10A illustrates a cross-sectional view of a package 200 in accordance with an alternative embodiment while FIG. 10B illustrates a corresponding top down view. Package 200 may be similar to package 100 where like reference numerals indicate like elements. In package 200, at least a portion of polymer layer 126 may be disposed in trench 130. That is, retaining wall portion 128" of UBM 128 may be completely covered by polymer layer 126. In package 200, lateral dimension W1 is greater than lateral dimension W2 is greater than lateral dimension W4 is greater than lateral dimension W3 is greater than lateral dimension W5.

Figure 11A:
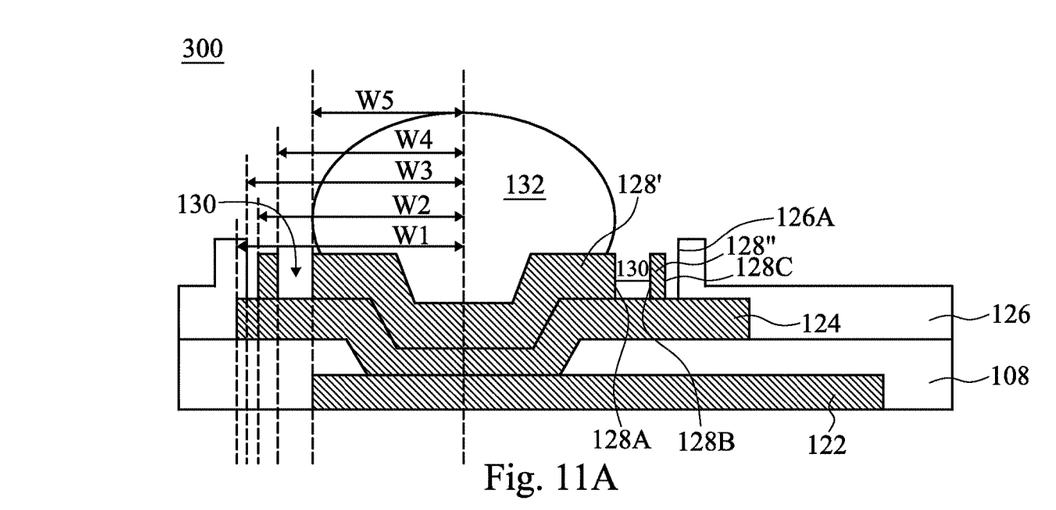
FIGS. 11A and 11B illustrate cross-sectional views of a device package in accordance with some alternative embodiments.
Figure 11B:
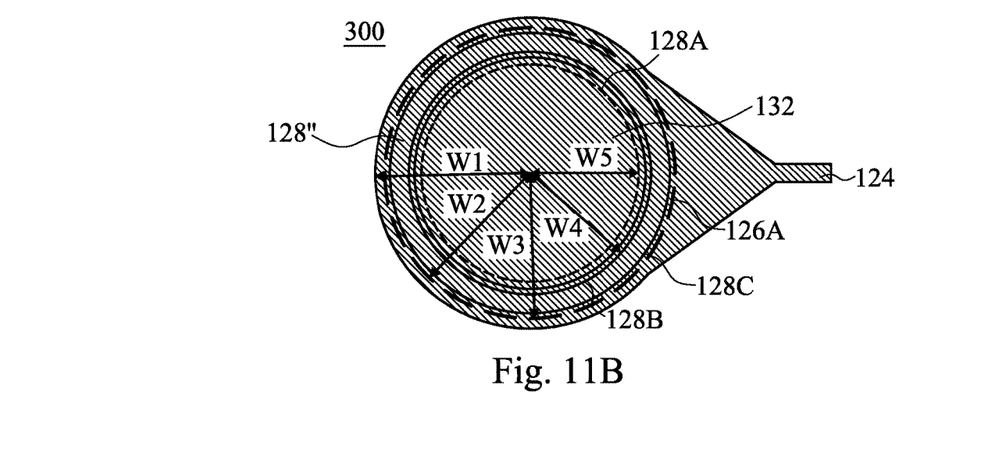

FIG. 11A illustrates a cross-sectional view of a package 300 in accordance with an alternative embodiment while FIG. 11B illustrates a corresponding top down view. Package 300 may be similar to package 100 where like reference numerals indicate like elements. In package 300, an entirety of UBM 128 may be exposed by an opening in polymer layer 126. That is, polymer layer 126 does not cover any portions of UBM 128, and polymer layer 126 encircles UBM 128. In package 300, lateral dimension W1 is greater than lateral dimension W3 is greater than lateral dimension W2 is greater than lateral dimension W4 is greater than lateral dimension W5.

Figure 12:
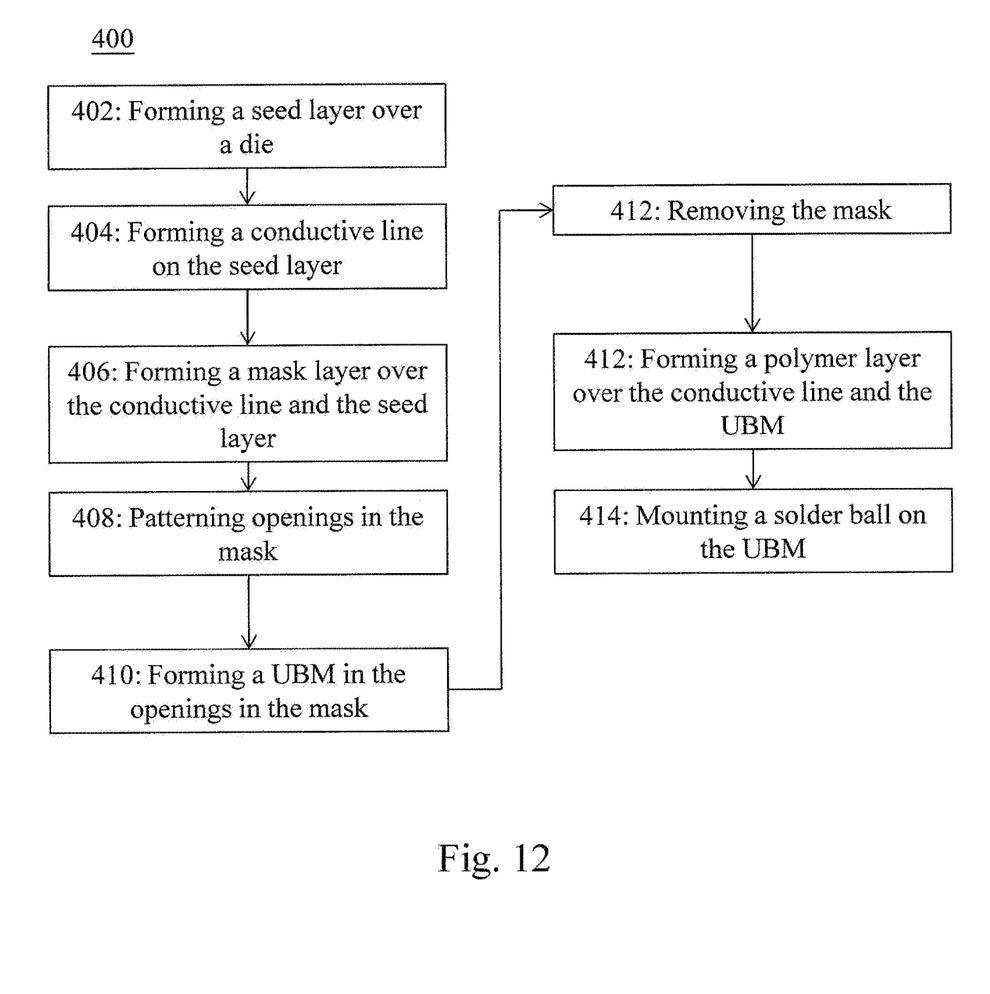
FIG. 12 illustrates a process flow for forming a device package in accordance with some embodiments.

FIG. 12 illustrates and example process flow 400 for forming a device package in accordance with various embodiments. In step 402, a seed layer (e.g., seed layer 134) is formed over a die (e.g., die 102). The seed layer may be formed over fan-out RDLs (e.g., RDLs 106) over the die. In step 404, a conductive line (e.g., conductive line 124) is formed on the seed layer. For example, a mask layer (e.g., mask layer 136) may be used to define a shape of the conductive line, and the conductive layer may be formed using a plating process using the seed layer to provide nucleation sites. The mask layer is then removed.

In step 408, a mask layer (e.g., mask layer 138) is formed over the conductive line and the seed layer. The mask layer may be different than the one used to form the conductive layer. In step 408, openings (e.g., openings 140) are patterned in the mask layer. The openings may include a first opening (e.g., opening 140A) for a conductive pad portion (e.g., conductive pad portion 128') of a UBM. The openings may include a second opening (e.g., opening 140B) for a retaining wall portion (e.g., retaining wall portion 128") of the UBM. A portion of the mask layer may remain disposed between the first and second openings. In step 410, a UBM (e.g., UBM 128) is formed in the openings of the mask layer. For example, a conductive pad portion of the UBM may be formed by filling the first opening, and a retaining wall portion of the UBM may be formed by filing the second opening. During the formation of the UBM, the conductive line and/or the seed layer may provide nucleation sites for a plating process. Then, in step 412, the mask layer is removed.

In step 412, a polymer layer (e.g., polymer layer 126) is formed over the conductive line and the UBM. An opening may be patterned in the polymer layer to expose the UBM. In an embodiment, the polymer layer may be cover edge portions of the UBM (e.g., edge portions of the retaining wall portion of the UBM). IN an embodiment, the polymer layer may completely expose the UBM. In an embodiment, the polymer layer completely covers the retaining wall portion of the UBM. In step 414, a connector (e.g., connector 132) is mounted on the UBM. The connector may be mounted on the conductive pad portion of the UBM.

Thus, in various embodiments, a UBM is formed over a top-most conductive line of the RDLs. The UBM may include a conductive pad portion and a retaining wall portion encircling the conductive pad portion, where a trench physically separates the conductive pad portion and the retaining wall portion. An external connector (e.g., a solder ball) is mounted on the conductive pad portion of the UBM, and a reflow process may be applied to adhere the connector to the UBM. By including a trench and a retaining wall around the conductive pad, the flux may be contained within the UBM during reflow processes. Thus, delamination issues from reflow may be reduced, improving manufacturing yield. Furthermore, the UBM and the conductive line may be formed using a single seed layer, which advantageously reduces manufacturing costs.

In accordance with an embodiment, a device package includes a die, fan-out redistribution layers (RDLs) over the die, and an under bump metallurgy (UBM) over the fan-out RDLs. The UBM comprises a conductive pad portion and a trench encircling the conductive pad portion. The device package further includes a connector disposed on the conductive pad portion of the UBM. The fan-out RDLs electrically connect the connector and the UBM to the die.

In accordance with another embodiment, a device package includes a device die, a conductive line over and electrically connected to the device die, a polymer layer extending over a top surface of the conductive line, and an under bump metallurgy (UBM) formed on a top surface of the conductive line. The UBM is at least partially exposed by an opening in the polymer layer. The UBM includes a conductive pad portion and a retaining wall portion forming a ring around the conductive pad portion. The retaining wall portion is separated from the conductive pad portion by a trench. A solder ball is disposed on the conductive pad portion of the UBM.

In accordance with yet another embodiment, a method for forming a device package includes forming a seed layer over a die, forming a conductive line on the seed layer, and forming a mask layer over the conductive line and the seed layer. Openings are patterned in the mask layer. The openings include a first opening for a conductive pad portion of an under bump metallurgy (UBM) and a second opening for a retaining wall portion of the UBM. The second opening forms a ring around the first opening, and a portion of the mask layer remains disposed between the first opening and the second opening. The method further includes forming the UBM in the first opening and the second opening, removing the first mask layer, and mounting a solder ball to the conductive pad portion of the UBM.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprises:
   a die;
   fan-out redistribution layers (RDLs) over the die;
   an under bump metallurgy (UBM) over the fan-out RDLs, wherein the UBM comprises:
      a conductive pad portion;
      a conductive retaining wall portion laterally separated from and encircling the conductive pad portion, the conductive retaining wall portion having a bottom-most portion physically contacting a conductive element of the fan-out RDLs;
      a trench encircling the conductive pad portion and separating the conductive pad portion and the conductive retaining wall portion, wherein a sidewall of the bottom-most portion of the conductive retaining wall directed away from the trench physically contacts an insulating material; and
   a connector disposed on the conductive pad portion of the UBM, wherein the fan-out RDLs electrically connect the connector and the UBM to the die.

2. The device package of claim 1, wherein a width of the retaining wall portion is about mum to about 20 μm.

3. The device package of claim 1, wherein the connector is not disposed on the retaining wall portion of the UBM.

4. The device package of claim 1, wherein a width of the trench is between about 10 μm to about 20 μm.

5. The device package of claim 1, wherein the fan-out RDLs comprise a conductive line, wherein the UBM is formed on a top surface of the conductive line, and wherein the trench exposes a portion of the conductive line.

6. The device package of claim 5, wherein the fan-out RDLs comprise a polymer layer extending over a top surface of the conductive line.

7. The device package of claim 6, wherein an entirety of the UBM is disposed in an opening in the polymer layer.

8. The device package of claim 6, wherein the polymer layer covers edge portions of the UBM.

9. The device package of claim 6, wherein the polymer layer is at least partially disposed in the trench.

10. A device package comprising:
    a device die;
    a conductive line over and electrically connected to the device die;
    a polymer layer extending over a top surface of the conductive line;
    an under bump metallurgy (UBM) formed on the top surface of the conductive line, wherein the UBM is at least partially exposed by an opening in the polymer layer, and wherein the UBM comprises:
       a conductive pad portion; and
       a conductive retaining wall portion forming a ring around the conductive pad portion, wherein the conductive retaining wall portion is separated from the conductive pad portion by a trench, wherein a bottom-most portion of the conductive retaining wall physically contacts the conductive line, and wherein a sidewall of a bottom-most portion of the conductive retaining wall directed away from the trench physically contacts material of the polymer layer; and
    a solder ball on the conductive pad portion of the UBM.

11. The device package of claim 10, wherein the trench encircles the conductive pad portion, and wherein the trench at least partially exposes the top surface of the conductive line.

12. The device package of claim 10, wherein the polymer layer is at least partially disposed in the trench.

13. The device package of claim 10, wherein the polymer layer covers edges of the retaining wall portion of the UBM.

14. The device package of claim 10, wherein the opening in the polymer layer completely exposes the UBM.

15. A device package comprising:
- a device die;
- a polymer layer over the device die;
- a conductive line in the polymer layer and electrically connected to the device die, wherein the polymer layer covers edges of the conductive line;
- a conductive pad contacting a surface of the conductive line, wherein the conductive pad is exposed by an opening in the polymer layer; and
- a conductive retaining wall having a bottom-most portion physically contacting the conductive line and surrounding the conductive pad in a top-down view of the device package, wherein the conductive retaining wall is separated from the conductive pad by a spacing, wherein the spacing is substantially free of any conductive material and surrounds the conductive pad in a top-down view of the device package, and wherein a sidewall of the bottom-most portion of the conductive retaining wall directed away from the spacing physically contacts the polymer layer.

16. The device package of claim 15, wherein the opening in the polymer layer exposes at least a portion of the conductive retaining wall.

17. The device package of claim 15, wherein the polymer layer covers edges of the conductive retaining wall.

18. The device package of claim 15, wherein a sidewall of the polymer layer is disposed in the spacing.

19. The device package of claim 15 further comprising a solder ball on the conductive pad, wherein the solder ball does not contact a top surface of the conductive retaining wall.

* * * * *